(12) United States Patent
Wu

(10) Patent No.: US 7,485,953 B2
(45) Date of Patent: Feb. 3, 2009

(54) CHIP PACKAGE STRUCTURE

(75) Inventor: Ping-Chang Wu, Jhudong Township, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/399,129

(22) Filed: Apr. 5, 2006

(65) Prior Publication Data

US 2007/0235853 A1 Oct. 11, 2007

(51) Int. Cl.
*H01L 23/48* (2006.01)
*H01L 23/52* (2006.01)
*H01L 29/40* (2006.01)

(52) U.S. Cl. .............. 257/686; 257/E25.003; 257/E23.151

(58) Field of Classification Search .................. 257/686
See application file for complete search history.

(56) References Cited

U.S. PATENT DOCUMENTS

| | | | | |
|---|---|---|---|---|
| 5,721,452 A | * | 2/1998 | Fogal et al. .................. | 257/685 |
| 6,359,340 B1 | * | 3/2002 | Lin et al. ..................... | 257/777 |
| 6,365,966 B1 | | 4/2002 | Chen et al. .................. | 257/723 |
| 6,461,897 B2 | * | 10/2002 | Lin et al. ..................... | 438/109 |
| 6,590,279 B1 | * | 7/2003 | Huang et al. ................. | 257/676 |
| 6,784,019 B2 | * | 8/2004 | Huang ......................... | 438/106 |
| 6,858,938 B2 | * | 2/2005 | Michii ......................... | 257/777 |
| 7,262,506 B2 | * | 8/2007 | Mess et al. ................... | 257/777 |
| 7,352,057 B2 | * | 4/2008 | Grafe et al. .................. | 257/686 |
| 2002/0011654 A1 | * | 1/2002 | Kimura ....................... | 257/686 |

FOREIGN PATENT DOCUMENTS

| TW | 454313 | 9/2001 |
|---|---|---|
| TW | M254725 | 1/2005 |

* cited by examiner

*Primary Examiner*—David A Zarneke
(74) *Attorney, Agent, or Firm*—J.C. Patents

(57) ABSTRACT

A chip package structure including a substrate, a first chip and a second chip is provided. The first contacts and the second contacts of the substrate are respectively arranged to reside on a first side region and a second side region of the substrate. The first chip disposed on the substrate and has a plurality of first bonding pads arranged to reside on a first wire-bonding region of the first chip adjacent to the first contacts and are electrically connected to the first contacts via a plurality of first wires. The second chip is disposed on the first chip away from the symmetrical center of the first chip. The second chip has a plurality of second bonding pads arranged to reside on a second wire-bonding region of the second chip adjacent to the second contacts and are electrically connected to the second contacts via a plurality of second wires.

5 Claims, 2 Drawing Sheets

CHIP PACKAGE STRUCTURE

BACKGROUND OF THE INVENTION

1. Field of the Invention

The present invention relates to a chip package structure. More particularly, the present invention relates to a stacked chip package structure.

2. Description of the Related Art

In the semiconductor manufacturing industry, the development of system-on-chip packages is affected by their relatively low yield and high production cost so that mass production is infeasible. Therefore, the higher yield stacked chip package structure, which can have a design meeting the chip scale package specification of most small electronic devices, is produced as a substitute.

FIG. 1 is a schematic side view showing the bonded wires inside a conventional chip package structure. The chip package structure 100 includes a substrate 110, a first chip 120 and a second chip 130 disposed on the first chip 120. The bonding pads 122 on the first chip 120 are electrically connected to the first contacts 112 on the substrate 110 via a plurality of first wires 124, and the first wires 124 belong to a first wire-bonding level. The second bonding pads 132 on the second chip 130 are electrically connected to the second contacts 114 on the substrate 110 via a plurality of second wires 134, and the second wires 134 belong to a second wire-bonding level. The second chip 130 is substantially located at the central region of the first chip 120. Furthermore, the central area of the first chip 120 can normally accommodate a single second chip 130 only. The area surrounding the central chip is mainly used for distributing the first bonding pads 122 for wire bonding. In addition, the distance D2 separating the first bonding parIs 122 distributed within the peripheral region of the first chip 120 from their corresponding first contacts 112 must be uniform. Similarly, the distance D1 separating the second bonding pads 132 distributed around the peripheral region of the second chip 130 from their corresponding second contacts 114 must be uniform.

It should be noted that the second wires 134 connecting the second bonding pads 132 to the respective second contacts 114 are rather long due to a greater distance of separation and has to cross over the first wires 124. When the distance separating the first wires 134 and the second wires 124 is reduced or if the molding flow process impacts the second conductive wires 134 and forces a sweep displacement, unwanted contacts between the first and the second wires 124, 134 in different wire-bonding levels may occur. Therefore, how to reduce the wire-bonding distance of the second wires 134 and prevent accidental contact between the bonding wires from different wire-bonding layers is an important issue to be resolved.

SUMMARY OF THE INVENTION

Accordingly, at least one objective of the present invention is to provide a chip package structure capable of preventing a short circuit due to a direct contact between bonding wires.

At least a second objective of the present invention is to provide a chip package structure that reduces wire-bonding distance by assigning the wire-bonding region of a chip according to different wire-bonding levels.

To achieve these and other advantages and in accordance with the purpose of the invention, as embodied and broadly described herein, the invention provides a chip package structure. The chip package structure includes a substrate, a first chip, a second chip, a plurality of first wires and a plurality of second wires. The substrate has a plurality of first contacts and a plurality of second contacts. The first contacts are arranged to reside on at least a first side region of the substrate and the second contacts are arranged to reside on at least a second side region of the substrate. The first chip disposed on the substrate has a plurality of first bonding pads, which are arranged to reside on a first wire-bonding region of the first chip adjacent to the first contacts. The second chip is disposed on the first chip away from the symmetrical center of the first chip. The second chip has a plurality of second bonding pads, which are arranged to reside on a second wire-bonding region of the second chip adjacent to the second contacts. In addition, the first contacts are electrically connected to the first bonding pads via the first wires. Similarly, the second contacts are electrically connected to the second bonding pads via the second wires.

According to one embodiment of the present invention, the second chip is disposed on a corner region or a side region of the first chip away from the first wire-bonding region. Furthermore, the first wire-bonding region is located on two adjacent side regions or a side region of the first chip adjacent to the first contacts, for example.

According to one embodiment of the present invention, the second wire-bonding region is located on two adjacent side regions or a side region of the second chip adjacent to the second contacts, for example.

The present invention also provides an alternative chip package structure. The chip package structure includes a substrate, a first chip, a plurality of second chips, a plurality of first wires and a plurality of second wires. The substrate has a plurality of first contacts and a plurality of second contacts. The first contacts are arranged to reside on at least a first side region of the substrate and the second contacts are arranged to reside on at least a second side region of the substrate. The first chip is disposed on the substrate and has a plurality of first bonding pads arranged to reside on a first wire-bonding region of the chip adjacent to the first contacts. The second chips are disposed on the first chip, but not on the symmetrical center of the first chip. Each second chip has a plurality of second bonding pads, which are arranged to reside on a second wire-bonding region of the second chip adjacent to the second contacts. In addition, the first contacts are electrically connected to the first bonding pads via the first wires and the second contacts are electrically connected to the respective second bonding pads of the second chips via the second wires.

According to one embodiment of the present invention, one of the second chips is disposed on one corner region of the first chip away from the first wire-bonding region. Another one of these second chips is disposed on a side region of the first region away from the first wire-bonding region. Moreover, the first wire-bonding region is located on the two adjacent side regions or a side region of the first chip adjacent to the first contacts, for example.

The second chip in the present invention is located away from the center of symmetry of the first chip and the substrate is connected to the second chip using second wires with the shortest path. Moreover, the first wires do not cross over the second wires located at a lower layer. Hence, short circuit due to an accidental contact between the first and the second wires at different connecting levels may be prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
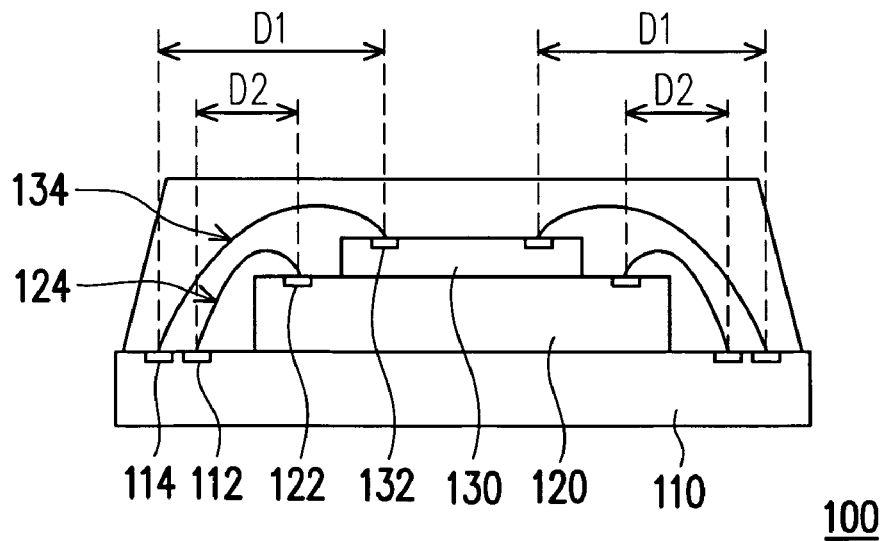
FIG. 1 is a schematic side view showing bonded wires inside a conventional chip package structure.

Reference will now be made in detail to the present preferred embodiments of the invention, examples of which are illustrated in the accompanying drawings. Wherever possible, the same reference numbers are used in the drawings and the description to refer to the same or like parts.

Figure 2:
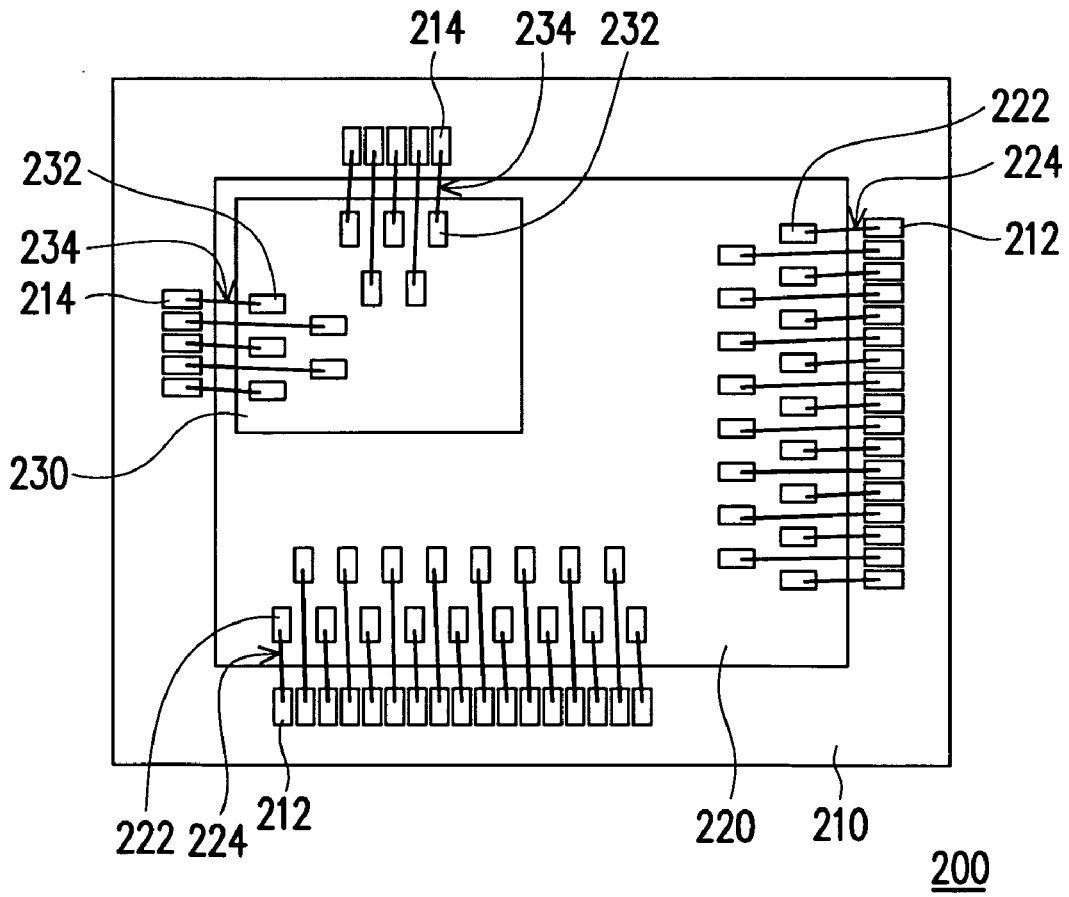
FIG. 2 is a top view showing a chip package structure according to a first embodiment of the present invention.

FIG. 2 is a top view showing a chip package structure according to a first embodiment of the present invention. As shown in FIG. 2, the chip package 200 has a wire-bonding stacked chip package structure. The chip package 200 includes a substrate 210, a first chip 220 and a second chip 230 disposed on the first chip 220. It should be noted that the second chip 230 is not disposed on the symmetrical center of the first chip 220 even though the second chip 230 is disposed on the first chip 220. In other words, the second chip 230 is not located at the central region of the first chip 220, but is disposed on a corner region of the first chip 220 instead. In the present embodiment, the second chip 230 is located on the left upper corner region of the first chip 220. However, in another embodiment (not shown), the second chip 230 can be disposed on one side region of the first chip 220 and the exact region can be suitably adjusted.

In the present embodiment, the location and the number of first bonding pads 222 in the first chip 220 depend on the input/output requirements. For example, the first bonding pads 222 can be arranged to reside in a single row or a plurality of alternately laid rows on the wire-bonding region at the lower right corner region instead of distributed equally around the chip as in the conventional design. The first bonding pads 222 can be arranged to reside as a group of pads on two adjacent side regions of the first chip 220. However, the first bonding pads 222 can also be arranged to reside on just one side region. The first bonding pads 222 are electrically connected to corresponding first contacts 212 via the first wires 224. Because the first bonding pads 222 are adjacent to the first contacts 212 on the substrate 210, the length of the first wires 224 for the bonding connection is minimized.

The second chip 230 disposed on the first chip 220 is relatively close to the second contacts 214 so that the second bonding pads 232 on the second chip 230 can connect with the second contacts 214 of the substrate 210 via the second wires 234 in the shortest distance. The location and number of second bonding pads 232 on the second chip 230 depend on the actual input/output requirements. For example, the second bonding pads 232 can be arranged to reside in a single row or a plurality of alternately laid rows on the wire-bonding region at the upper left corner region instead of distributed equally around the chip as in the conventional design. Moreover, the second bonding pads 232 can be arranged to reside as a group of pads on two adjacent side regions of the second chip 230. However, the second bonding pads 232 can also be arranged to reside on just one side region.

Vertical projections of the plurality of first bonding pads 222 on the substrate 210 fall within a first area of the substrate 210 and vertical projections of the plurality of second bonding pads 232 on the substrate 210 fall within a second area of the substrate 210. The first area and the second area are separated from each other. In addition, Vertical projections of the plurality of first wires 224 on the substrate 210 fall within the first area of the substrate 210, vertical projections of the plurality of second wires 234 on the substrate 210 fall within the second area of the substrate 210, the vertical projections of the first wires 224 and the vertical projections of the second wires 234 are not alternately arranged on the substrate 210, and the first wires 224 are not directly electrically connected to the second bonding pads 232 of the second chip 230.

Figure 3:
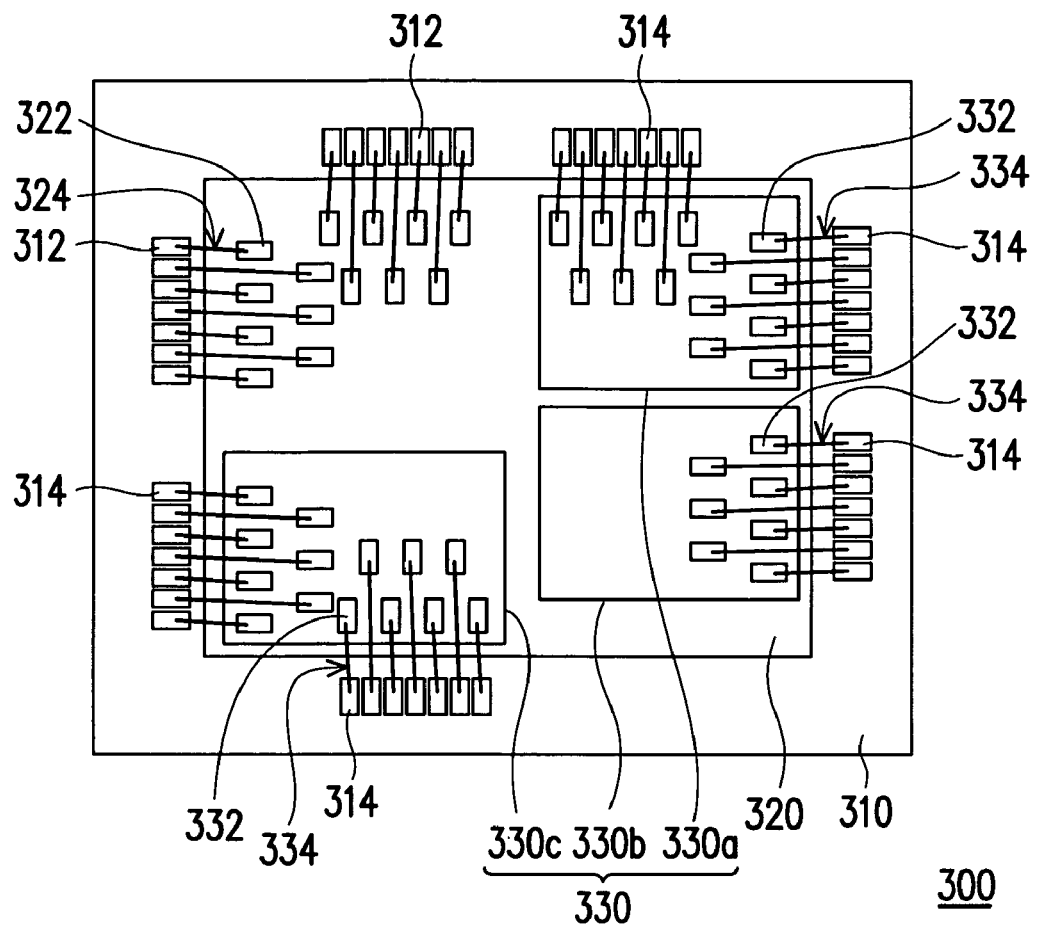
FIG. 3 is a top view showing a chip package structure according to a second embodiment of the present invention.

FIG. 3 is a top view showing a chip package structure according to a second embodiment of the present invention. The chip package structure 300 as shown in FIG. 3 includes a substrate 310, a first chip 320 and a plurality of second chips 330 disposed on the first chip 320. In a way similar to the first embodiment, the second chips 330 in the present embodiment are not disposed on the symmetrical center of the first chip 320 even though they are disposed on the first chip 320. In other words, the second chips 330 are not located at the central region of the first chip 320, rather, they are disposed a corner region or a side region of the first chip 320. In the present embodiment, the second chip 330a is located on the upper right corner region of the first chip 320. Similarly, the second chip 330b is located in a side region of the first chip 320, and the second chip 330c is located on the lower left corner region of the first chip 320. The number of second chips 330 can be singular or plural and the size and location of the second chips 330 can be suitable adjusted.

The aforementioned first chip 320 has a plurality of first bonding pads 322 arranged to reside on a first wire-bonding region of the chip 320 adjacent to the first contacts 312. For example, the first wire-bonding region is located on two adjacent side regions or a side region of the first chip 320 adjacent to the first contacts 312 so that the wire-bonding distance can be reduced. Furthermore, the second chips 330 each has a plurality of second bonding pads 332 arranged to reside in a second wire-bonding region adjacent to the contacts 314. Moreover, the second wire-bonding regions are located on the two adjacent side regions or a side region of the second chips close to the second contacts 314 so that the wire-bonding distance can be reduced.

Figure 4:
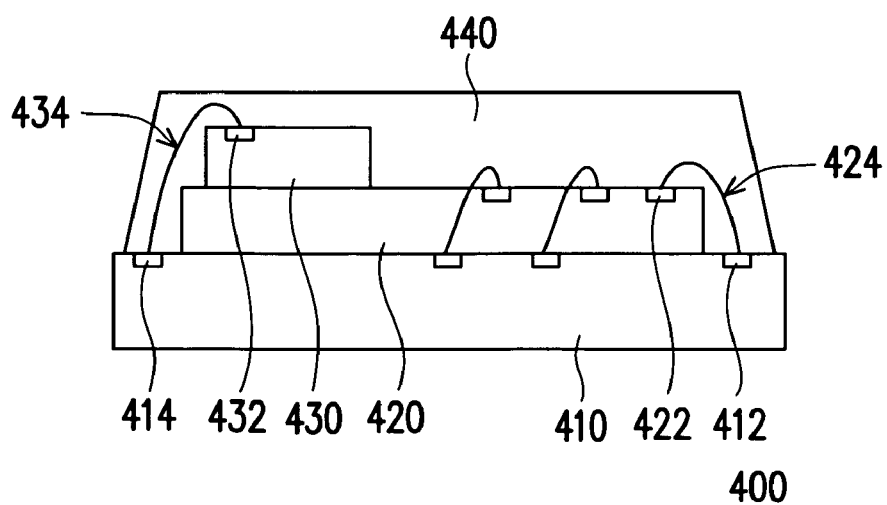
FIG. 4 is a side view showing the bonded wires in the chip package structure according to the present invention.

FIG. 4 is a side view showing the bonded wires in the chip package structure according to the present invention. The first bonding pads 422 on the lower first chip 410 are electrically connected to the first bonding pads 412 on the substrate 410 via the first wires 424 and the first wires 424 belong to the first wire-bonding level. The second bonding pads 232 on the upper second chip 430 are electrically connected to the second contacts 414 of the substrate 410 via the second wires 434 and the second wires 434 belong to the second wire-bonding level. It should be noted that the first and the second wires 424, 434 belonging to different wire-bonding levels could not contact each other to short circuit because the second chip 430 is disposed in an offset location away from the symmetrical center of the first chip 420. Therefore, compared with the conventional design of mixing the wires from different wire-bonding levels, the chip package structure 400 in the present invention has a better wire-bonding reliability and a shorter wire-bonding length for increasing the signal transmission speed. Lastly, the first chip 420, the second chip 430, the first wires 424 and the second wires 434 are encapsulated using a molding compound 440 to form the chip package structure 400 as shown in FIG. 4.

In summary, the chip package structure in the present invention has one or more than one upper second chips disposed in a location away from the symmetrical center of the first chip. Furthermore, the second chip and the substrate are electrically connected using the shortest second wires. Moreover, the second wires will never cross over the first wires, thereby preventing the first and thee second wires belonging to different wire-bonding levels from contacting each other to form a short circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
   a substrate having a plurality of first contacts and a plurality of second contacts, wherein the first contacts are arranged to reside on at least a first side region of the substrate, and the second contacts are arranged to reside on at least a second side region of the substrate;
   a first chip disposed on the substrate, wherein the first chip has a plurality of first bonding pads arranged to reside on a first wire-bonding region of the first chip adjacent to the first contacts, and vertical projections of the plurality of first bonding pads on the substrate fall within a first area of the substrate;
   at least one second chip disposed on the first chip and away from the symmetrical center of the first chip, wherein the second chip has a plurality of second bonding pads arranged to reside on a second wire-bonding region of the second chip adjacent to the second contacts, vertical projections of the plurality of second bonding pads on the substrate fall within a second area of the substrate and the first area and the second area are separated from each other;
   a plurality of first wires located on a first level for electrically connecting the first contacts with corresponding first bonding pads; and
   a plurality of second wires located on a second level for electrically connecting the second contacts with corresponding second bonding pads, wherein vertical projections of the plurality of first wires on the substrate fall within the first area of the substrate, vertical projections of the plurality of second wires on the substrate fall within the second area of the substrate, the vertical projections of the first wires and the vertical projections of the second wires are not alternately arranged on the substrate, and the first wires are not directly electrically connected to the second bonding pads of the second chip.

2. The chip package structure of claim 1, wherein the second chip is disposed on a corner region of the first chip away from the first wire-bonding region.

3. The chip package structure of claim 1, wherein the first wire-bonding region is located on two adjacent side regions or one side region of the first chip adjacent to the first contacts.

4. The chip package structure of claim 1, wherein the second wire-bonding region is located on two adjacent side regions or one side region of the second chip adjacent to the second contacts.

5. The chip package structure of claim 1, the chip package structure further comprises a molding compound encapsulating the first chip, the second chip, the first wires and the second wires.

* * * * *